United States Patent [19]

Manecke et al.

[11] 4,055,724
[45] Oct. 25, 1977

[54] PROTECTIVE SHIELD FOR A CONTROL DEVICE

[75] Inventors: Siegfried E. Manecke; James L. Shaw, both of Indiana, Pa.

[73] Assignee: Robertshaw Controls Company, Richmond, Va.

[21] Appl. No.: 601,514

[22] Filed: Aug. 4, 1975

Related U.S. Application Data

[62] Division of Ser. No. 499,327, Aug. 21, 1974, Pat. No. 3,914,661.

[51] Int. Cl.² ............................................. H05K 5/03
[52] U.S. Cl. ..................................................... 174/66
[58] Field of Search .................... 174/66, 5, 138 F; 220/241; 339/198 J

[56] References Cited

U.S. PATENT DOCUMENTS

| 1,097,207 | 5/1914 | Barr | 174/66 X |
|---|---|---|---|
| 3,242,293 | 3/1966 | Manacke | 219/330 UX |
| 3,621,197 | 11/1971 | Place | 174/138 F X |
| 3,626,151 | 12/1971 | Them | 174/5 R X |
| 3,914,660 | 10/1975 | Stearley | 174/5 R X |

Primary Examiner—J. V. Truhe
Assistant Examiner—D. A. Tone
Attorney, Agent, or Firm—Candor, Candor & Tassone

[57] ABSTRACT

A control device having a housing provided with a selector knob and dial arrangement adjacent the knob, the housing also having electrical terminals adjacent the knob and dial arrangement. A substantially flat protective shield is secured to the control device and covers the terminals, the shield having two separate openings passing therethrough so that one of the openings exposes the dial arrangement and the other of the openings has the selector knob telescopically projecting therethrough.

7 Claims, 9 Drawing Figures

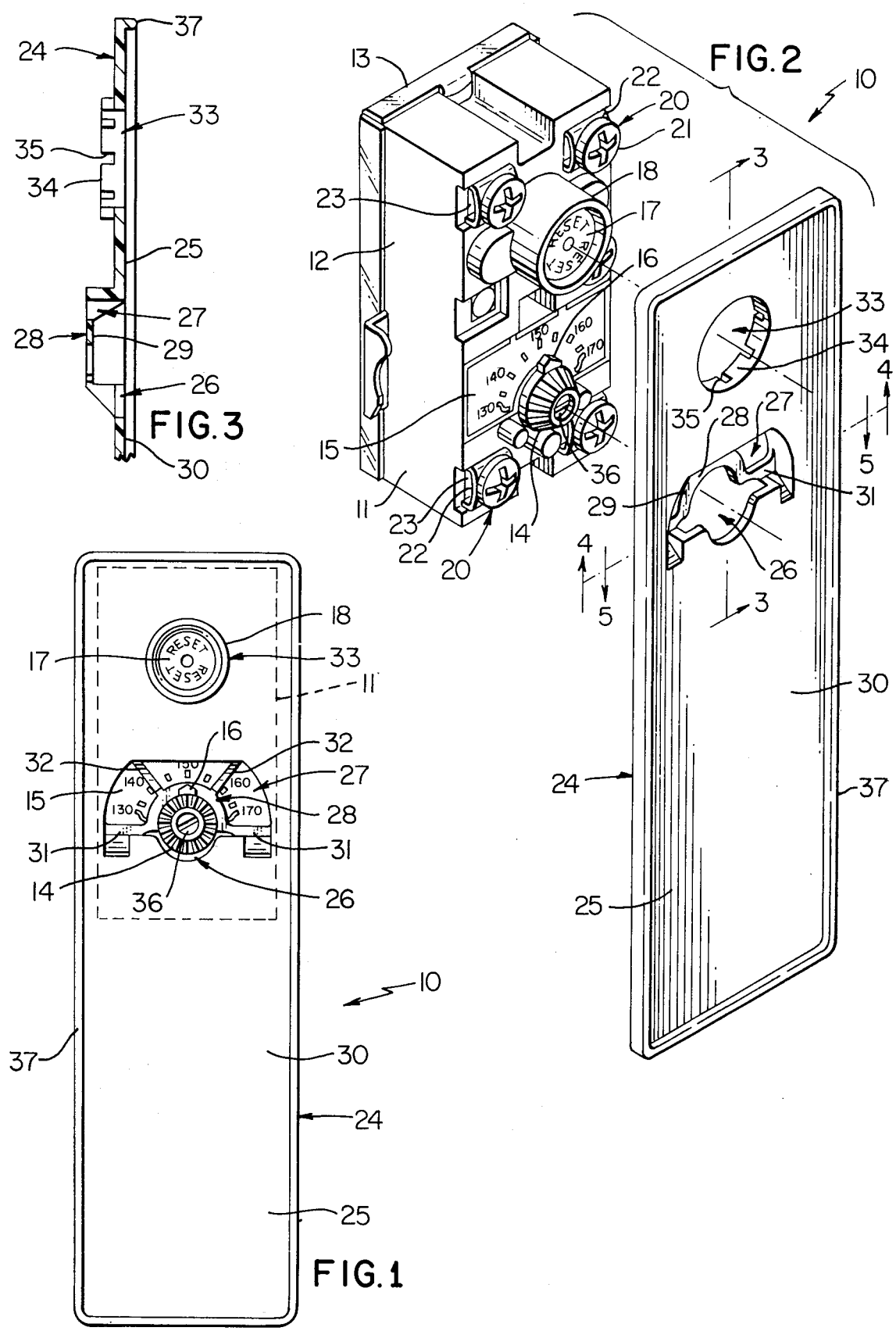
U.S. Patent  October 25, 1977  Sheet 1 of 2  4,055,724

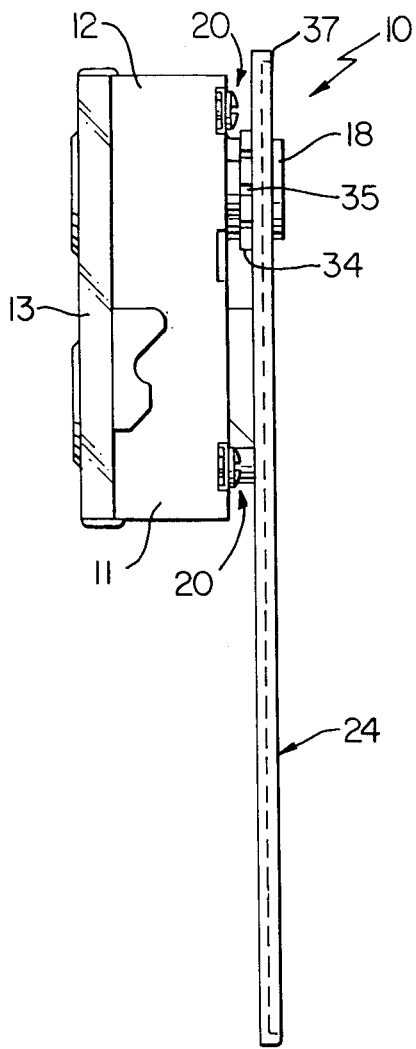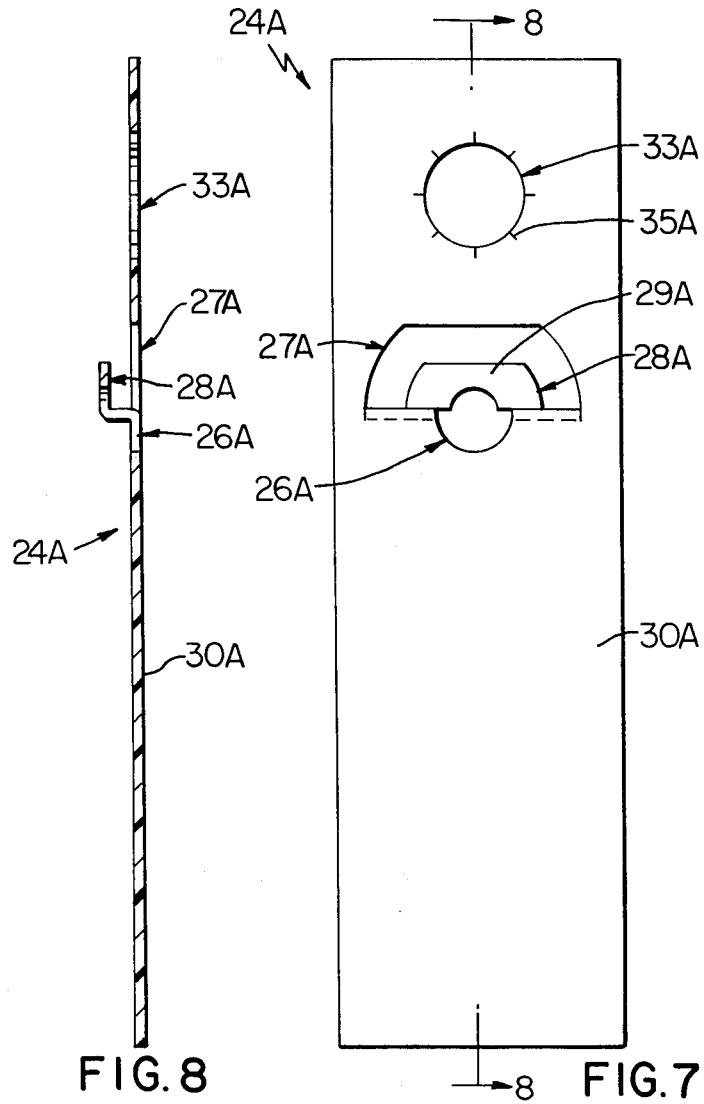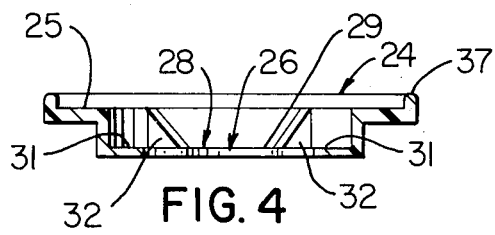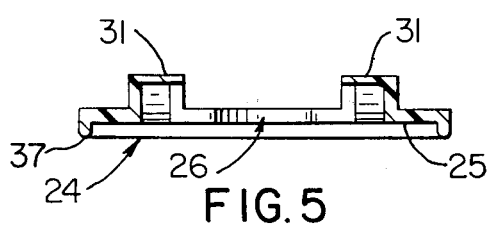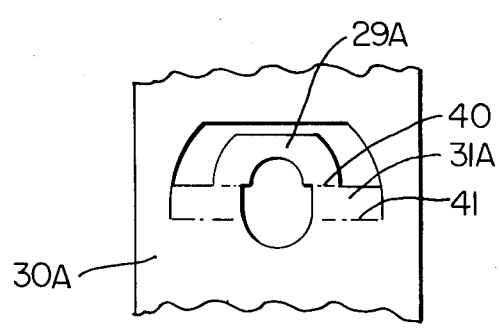

4,055,724

PROTECTIVE SHIELD FOR A CONTROL DEVICE

This application is a divisional application of its copending parent application, Ser. No. 499,327 filed Aug. 21, 1974, now U.S. Pat. No. 3,914,661.

This invention relates to a shielded control device as well as to an improved protective shield therefor.

It is well known that various control devices have been provided wherein each has a housing means provided with a selector knob for setting the control device to a particular operating condition thereof. Such control device also has a terminal means for permitting leads to be attached thereto and, in certain cases, such lead attachment is relatively close to the selector knob location so that it is desired to protect the user from accidentally contacting such terminals when adjusting the selector knob.

For example, such control devices can comprise theremostats that are mounted on water heaters for controlling the heating operation thereof in relation to the temperature setting set by the selector knobs thereof.

Accordingly, protective electrically insulating shields have been provided that can be secured to such control devices to cover not only the terminal means of the control devices, but also to cover adjacent electrical structure while still permitting ready access to the selector knobs for temperature selection purposes.

For example, see the U.S. Pat. to Place, No. 3,621,197, and the U.S. Pat. to Them, No. 3,626,151.

It is a feature of this invention to provide an improved protective shield of the above general type for shielding the terminal means of such a control device or the like while still effectively exposing the selector knob thereof for condition setting purposes and the like.

It is another feature of this invention to provide an improved shielded control device utilizing such a protective shield or the like.

In particular, one embodiment of this invention provides a control device having a housing provided with a selector knob and dial arrangement adjacent the knob, the housing having electrical terminal means adjacent the knob and dial arrangement. A substantially flat protective shield is secured to the control device and covers the terminal means thereof, the shield having two separate openings means passing therethrough, one of which exposes the dial arrangement and the other having the selector knob projecting therethrough to permit manual grasping of the same. A web portion of the shield separates the two opening means from each other and has a part thereof offset relative to the shield by another part thereof so that the offset part will be disposed against the control device to properly space the shield relative thereto.

Accordingly, it is an object of this invention to provide an improved shielded control device having one or more of the novel features set forth above or hereinafter shown or described.

Another object of this invention is to provide an improved prtective shield for such a control device or the like.

Other objects, uses and advantages of this invention are apparent from a reading of this description, which proceeds with reference to the accompanying drawings forming a part thereof and wherein:

FIG. 1 is a front view of the improved shielded control device of this invention.

FIG. 2 is an exploded perspective view illustrating the control device and protective shield therefor.

FIG. 3 is an enlarged, fragmentary, cross-sectional view taken substantially on line 3—3 of FIG. 2.

FIG. 4 is a cross-sectional view taken on line 4—4 of FIG. 2.

FIG. 5 is a cross-sectional view taken on line 5—5 of FIG. 2.

FIG. 6 is a side view of the shielded control device of FIG. 1.

FIG. 7 is a front view of another embodiment of the protective shield of this invention.

FIG. 8 is a cross-sectional view taken on line 8—8 of FIG. 7.

FIG. 9 is a fragmentary view of the protective shield of FIG. 7 before the web portion thereof has been formed into its final configuration.

While the various features of this invention are hereinafter described and illustrated as being particularly adapted to provide a protective shield for a control device that is utilized for temperature controlling purposes, it is to be understood that the various features of this invention may be utilized singly or in any combination thereof to provide a protective shield for other types of control devices as desired.

Therefore, this invention is not to be limited to only the embodiments illustrated in the drawings, because the drawings are merely utilized to illustrate one of the wide variety of uses of this invention.

Referring now to FIGS. 1 and 2, the improved shielded control device arrangement of this invention is generally indicated by the reference numeral 10 and comprises a control device 11 having a one-piece housing 12 closed by a rear cover means 13 and containing suitable electrical switch means, temperature sensing means and the like for effectively controlling the heating operation of a water heater or the like. The housing 12 carries a selector knob 14 and dial arrangement 15 adjacent thereto for permitting the user to select the desired temperature setting for the control device 11 in a manner well known in the art whereby the positioning of a pointer 16 on the control knob 14 to a desired temperature indication on the dial arrangement 15 will cause the control device 11 to tend to maintain the temperature of the water heater at such selected temperature.

The housing 12 also carries a reset button 17 disposed in a cylindrical projection 18 thereof so that should the sensed temperature exceed a certain high limit, other switching means in the control device 11 will terminate the operation thereof until the reset button 17 is pressed to reset the control device 11 in a manner well known in the art.

In order to interconnect suitable electrical leads to the control device 11, a plurality of terminal means 20 are carried by the housing means 12 and each can comprise a threaded fastering member 21 for clamping a bared wire lead end beneath a deformable clip 22 and a conductive surface 23 that leads to the interior of the housing means 12 so that such lead will be attached to the housing means 12 and be electrically interconnected to the conductor 23 thereof.

As previously stated, it can readily be seen that such terminal means 20 are disposed relatively close to the selector knob 14 as well as to the reset button 17 so that when such control device 11 is mounted to a water heater or the like and a person desires to adjust the temperature setting thereof, a person might accidentally contact one of the terminal means 20 and thereby be subjected to an adverse electrical shock, etc.

Accordingly, a protective shield of this invention that is generally indicated by the reference numeral 24 is utilized to shield the terminal means 20 of the control device 11 in the manner illustrated in FIG. 1 by being attached to the housing 12 of the control device 11 while still exposing the control knob 14, dial arrangement 15 and reset button 17 at the front surface 25 of the shield 24. Thus, the operator can have access to the control parts of the control device 11 while the terminal means 20 are effectively covered by the shield 24 at the front surface 25 thereof. Additionally, the shield 24 of this invention can be so constructed and arranged so that the same will extend beyond the control device 11 in any desired direction and distance to effectively cover electrical control means that will be mounted in an associated manner with the control device 11 as provided in the aforementioned U.S. Pat. Nos. 3,261,197 and 3,626,151.

The protective shield 24 of this invention can be formed of any suitable electrical insulating material, such as a vulcanized fiber sheet, polypropylene, etc., and can be formed from a stamping operation, a molding operation, etc., as desired.

The protector shield 24 has two separate openings 26 and 27 formed therethrough and being separated from each other by a web portion 28 of the shield 24 that is integral therewith and has a part 29 offset relative to the main body part 30 of the shield 24 by other parts 31 of the web portion 28 whereby the web part 29 is adapted to be disposed substantially parallel and spaced to the body part 30 of the shield 24 for engagement against the control housing 12 to properly space the body part 30 relative thereto as will be apparent hereinafter.

If desired, the offset part 29 can be reinforced in its position by web parts 32 spanning the opening means 27 as illustrated in FIG. 1, such spanning parts 32 being relatively small and thereby being substantially insignificant in their blocking of the opening means 27 as will be apparent hereinafter.

A third opening means 33 is formed through the shield 24 and is substantially cylindrical to telescopically receive, in a press-fit manner, the cylindrical projecting part 18 of the housing 12 as illustrated in FIGS. 1 and 6. If desired, a cylindrical flange 34 can be formed integrally with the sheet 24 adjacent the opening 33 to facilitate the press-fit relation with the cylindrical part 18 of the housing 12, such flange 34 being provided with a plurality of slit means 35 therein to render such flange 34 substantially resilient for the aforementioned press-fit relation.

The shield 24 can be further reinforced by providing a peripheral bead or edge 37 about the same as illustrated to thereby provide structural strength to the main body portion 30 thereof.

After the shield 24 has been formed in the above manner, the same can be readily assembled to the control device 11, after the leads have been attached to the terminal means 20 in the manner previously described.

In particular, the shield 24 can be disposed over the control knob 14 to be assembled to a control shaft 36 thereof that carries the control knob 14 which is either fastened to the shaft 36 by threaded fastening means or is press-fit thereon in a conventional manner. The shield 24 is assembled over the control knob 14 and through flexure of the shield 24 in such a manner, the shield 24 is held to the housing 12 of the control device 11 by having the projecting cylindrical part 18 of the housing means 11 press-fit into the opening 33 of the shield 24 while the offset web portion 29 of the web portion 28 of the shield 24 engages against the dial arrangement 15 in the manner illustrated in FIGS. 1 and 6 and the knob 14 projects through the opening 26 of the shield 24.

Thus, it can be seen that at least a part of the control knob 14, such as the pointer 16 thereof, will overlap the offset web part 29 of the web portion 28 as illustrated in FIG. 1 to hold and lock the shield 24 in its assembled relation with the control device 11.

Therefore, the control knob 14 telescopically projects through the opening 26 of the shield 24 to permit the user to rotate the selector knob 14 for temperature setting purposes while the dial arrangement 15 is fully exposed through the other opening means 27 of the shield 24. Obviously, the push button 17 is also exposed at the third opening means 33 of the shield 24 as the cylindrical part 18 telescopically passes therethrough in the manner illustrated in FIG. 6.

In this manner, it can readily be seen that the shield 24 covers the terminal means 20 of the control device 11 to protect the user thereof while still permitting the user to operate the selector knob 14 for temperature selection purposes, the shield 24 being locked in place by at least the pointer 16 of the control knob 14 as well as by the press-fit relation of the cylindrical part 18 of the housing 11 with the shield 24.

Another protective shield of this invention is generally indicated by the reference numeral 24A in FIGS. 7-9 and can be utilized in place of the protective shield 24 previously described to protect the control device 11 previously described, parts of the shield 24A that are substantially identical to like parts of the shield 24 are indicated by like reference numerals followed by the reference letter "A".

As illustrated in FIGS. 7-9, the protective shield 24A is formed from a substantially flat blank of material and has the three opening means 26A, 27A and 33A formed therethrough with the web portion 28A separating the openings 26A and 27A from each other. However, the opening 33A does not have a depending flange around the same so that the body material 30A of the shield 24A can be provided with slit means 35A that radiate from the opening 33A to facilitate the press-fit relation of the opening 33A on the cylindrical part 18 of the housing means 12 of the control device 11 in the manner previously described.

As illustrated in FIG. 9, the blank of material 24A can be formed as illustrated while in flat form to provide fold lines 40 and 41 that define the parts 31A and 29A of the web portion 28A so that when the web portion 28A is subsequently folded on the lines 40 and 41, the web part 29A can be disposed in offset relation to the main body 30A while being parallel thereto for engaging against the housing 12 of the control device 11 to properly space the body portion 30A relative to the front of the housing 12 in a manner similar to the web portion 28 of the shield 24 previously described.

Thus, it can be seen that the selector knob 14 of the control device 11 can project through the opening 26A of the shield 34A while the dial arrangement 15 would be exposed at the opening 27A after the shield 24A is assembled to the control device 11 by having at least the pointer 16 of the knob 14 overlap the web part 29A to lock the shield 24A thereto in the same manner as the shield 24 previously described.

Therefore, it can be seen that this inventio not only provides an improved shielded control device arrangement, but also this invention provides an improved protective shield therefor.

While the forms of the invention now preferred have been illustrated and described as required by the Patent Statute, it is to be understood that other forms can be utilized and still come within the scope of the appended claims.

What is claimed is:

1. A substantially flat protective shield for a control device having a housing provided with a selector knob and dial arrangement adjacent said knob as well as electrical terminal means adjacent said knob and dial arrangement, said protective shield being adapted to be secured to said control device to cover said terminal means, said shield having two separate opening means therethrough, one of said opening means being adapted to expose said dial arrangement and the other of said opening means being adapted to have said selector knob projecting therethrough, said housing having a projecting part spaced from said selector knob, said shield having a third opening means adapted to telescopically receive said projecting part of said housing, said projecting part of said housing being adapted to be press-fit in said third opening means, said shield having a plurality of slit means therein adjacent said third opening means to facilitate said press-fit relation.

2. A substantially flat protective shield for a control device having a housing provided with a selector knob and dial arrangement adjacent said knob as well as electrical terminal means adajcent said knob and dial arrangement, said protective shield being adapted to be secured to said control device to cover said terminal means, said shield having two separate opening means therethrough, one of said opening means being adapted to expose said dial arrangement and the other of said opening means being adapted to have said selector knob projecting therethrough, said shield having a web portion thereof separating said two opening means from each other, said web portion having a part thereof offset relative to said shield by another part thereof, said offset part of said web portion being disposed spaced from and parallel to said shield while being adapted to engage against said housing to space said shield therefrom.

3. A protective shield as set forth in claim 2 wherein said offset part of said web portion is adapted to be disposed between said knob and said housing to lock said shield to said housing.

4. A protective shield as set forth in claim 2 wherein said housing has a projecting part spaced from said selector knob, said shield having a third opening means adapted to telescopically receive said projecting part of said housing.

5. A protective shield as set forth in claim 4 wherein said projecting part of said housing is adapted to be press-fit in said third opening means, said shield having a plurality of slit means therein adjacent said third opening means to facilitate said press-fit relation.

6. A protective shield as set forth in claim 4 wherein said projecting part of said housing is adapted to be press-fit in said third opening means, said shield having an annular flange extending adjacent said third opening to facilitate said press-fit relation.

7. A substantially flat protective shield for a control device having a housing provided with a selector knob and dial arrangement adjacent said knob as well as electrical terminal means adjacent said knob and dial arrangement, said protective shield being adapted to be secured to said control device to cover said terminal means, said shield having two separate opening means therethrough, one of said opening means being adapted to expose said dial arrangement and the other of said opening means being adapted to have said selector knob projecting therethrough, said shield having a web portion thereof separating said two opening means from each other, said web portion having at least one reinforcing part thereof spanning one of said openings.

* * * * *